US005654918A

United States Patent [19]

Hammick

[11] Patent Number: 5,654,918

[45] Date of Patent: Aug. 5, 1997

[54] REFERENCE CIRCUIT FOR SUPPLYING A REFERENCE LEVEL FOR SENSING IN A MEMORY

[75] Inventor: Michael Charles Hammick, Almondsbury, United Kingdom

[73] Assignee: SGS-Thomson Microelectronics Limited, Almondsbury, United Kingdom

[21] Appl. No.: 558,319

[22] Filed: Nov. 15, 1995

[30] Foreign Application Priority Data

Nov. 15, 1994 [GB] United Kingdom .................. 9423034

[51] Int. Cl.[6] .................................................. G11C 11/34

[52] U.S. Cl. ................................ 365/185.2; 365/185.21; 365/185.24; 365/185.33

[58] Field of Search ........................... 365/189.09, 185.2, 365/185.21, 185.24, 185.33, 203

[56] References Cited

U.S. PATENT DOCUMENTS

| | | | |
|---|---|---|---|
| 5,255,233 | 10/1993 | Izumi | 365/207 |
| 5,291,446 | 3/1994 | Van Buskirk et al. | 365/189.09 |
| 5,339,272 | 8/1994 | Tedrow et al. | 365/189.09 |
| 5,487,045 | 1/1996 | Trodden | 365/189.09 |

FOREIGN PATENT DOCUMENTS

| | | | |
|---|---|---|---|
| A-0 347 909 | 12/1989 | European Pat. Off. | G11C 17/00 |
| A-0 454 579 | 10/1991 | European Pat. Off. | G11C 16/06 |
| A-0 454 250 | 10/1991 | European Pat. Off. | G05F 3/26 |
| A-0 514 350 | 11/1992 | European Pat. Off. | G11C 16/06 |
| A-0 511 675 | 11/1992 | European Pat. Off. | G05F 3/24 |
| A-0 539 593 | 5/1993 | European Pat. Off. | G05F 1/56 |
| A-0 576 046 | 12/1993 | European Pat. Off. | G11C 17/00 |
| A-2 265 478 | 9/1993 | United Kingdom | G05F 3/24 |
| WO-A-93 18412 | 9/1993 | WIPO | G01R 19/00 |

OTHER PUBLICATIONS

Standard Search Report issued by the European Patent Office on Feb. 20, 1995.

*Primary Examiner*—David C. Nelms
*Assistant Examiner*—Trong Quang Phan
*Attorney, Agent, or Firm*—Wolf, Greenfield & Sacks, P.C.

[57] ABSTRACT

A reference circuit including a reference cell for generating a reference current in response to a control voltage. The reference current is received by a first branch of a first current mirror circuit and a matched current is generated in a second branch of the mirror circuit. An output device is connected to receive the matched current and to supply a reference level derived from the matched current. A dividing circuit selectively reduces the reference level derived from the first matched current from a first full reference level to a second reduced reference level. The reference circuit is particularly suitable for memory devices having memory cells formed by integrated gate transistors.

16 Claims, 7 Drawing Sheets

FIG. 3

| | SELECTED CELL | | | UNSELECTED CELL SAME ROW | | | UNSELECTED CELL SAME COLUMN | | |
|---|---|---|---|---|---|---|---|---|---|
| | DRAIN VOLTAGE D | GATE VOLTAGE CG | SOURCE VOLTAGE S | DRAIN VOLTAGE D | GATE VOLTAGE CG | SOURCE VOLTAGE S | DRAIN VOLTAGE D | GATE VOLTAGE CG | SOURCE VOLTAGE S |
| PROGRAM | ~5V | $V_{PP}$ | $V_{GND}$ | $V_{GND}$ | $V_{PP}$ | $V_{GND}$ | ~5V | $V_{GND}$ | $V_{GND}$ |
| ERASE* | FLOATING | $V_{GND}$ | $V_{PP}$ | FLOATING | $V_{GND}$ | $V_{PP}$ | FLOATING | $V_{GND}$ | $V_{PP}$ |
| READ | BIASED TO ~1V | ~5V | $V_{GND}$ | $V_{GND}$ | ~5V | $V_{GND}$ | BIASED TO ~1V | $V_{GND}$ | $V_{GND}$ |

* ALL CELLS SELECTED IN ERASE

REFERENCE CIRCUIT FOR SUPPLYING A REFERENCE LEVEL FOR SENSING IN A MEMORY

FIELD OF THE INVENTION

The present invention relates to a reference circuit and particularly but not exclusively to a reference circuit arranged to provide a reference level for sensing in a memory.

BACKGROUND TO THE INVENTION

The invention is particularly but not exclusively concerned with sensing in a memory device in which memory cells are formed by insulated gate transistors such as a PROM, EPROM or FLASH EPROM. However, the reference circuit can be used in any situation where a reference level is required.

When providing a reference level for sensing, one criteria which should be met is that the reference level can be supplied to a plurality of sensing circuits without altering the reference level.

For flash memories, the level required for sensing during a read operation is normally set at a fraction of the sum of the signals generated by a programmed cell and an erased cell, for example a half. It is advantageous to generate this reference level such that it is dependent on the characteristics of other identical flash memory cells. While it would be possible to provide a reference flash memory cell having a threshold voltage altered to provide a signal level which is, for example, halfway between the signals generated by a programmed cell and an erased cell, such a cell could not be used to generate a reference current for sensing both programmed and erased cells the reference signal will not be accurately maintained in the case of normal variations in the supply level Vcc, and hence the voltage applied to the gate of the reference cell. It is therefore desirable to use as a reference cell a cell having a threshold voltage sufficiently below the gate voltage to guarantee adequate sensing current, i.e. an erased cell.

SUMMARY OF THE INVENTION

According to the present invention there is provided a reference circuit comprising: at least one reference cell for generating a reference current in response to a control voltage; a first current mirror circuit connected to receive in a first branch thereof said reference current and to generate in a second branch thereof a first matched current; an output device connected to receive said first matched current and to supply a reference level derived from said first matched current; and a dividing circuit for selectively reducing the reference level derived from said first matched current from a first, full reference level to a second, reduced reference level.

In the described embodiment, the dividing circuit is a divide-by-two circuit for generating a second, reduced reference level which is half the first, full reference level. Thus, this reference level can be used for a read operation in a flash memory.

The dividing circuit can comprise a transistor connected in parallel with the output transistor and a control transistor having a controllable path connected between control terminals of the output transistor and the parallel transistor. The control transistor has a control terminal controllable by a divide-by-two signal so that both the output transistor and the parallel transistor are turned on simultaneously whereby half the first matched current flows through the output. transistor.

For providing a plurality of reference levels, the reference circuit can include a plurality of reference cells arranged to provide different reference currents and selection circuitry for selecting a desired one of said reference cells. The reference cells can be programmed with different threshold voltages.

In a flash memory, each reference cell is a single transistor floating gate cell having a preselected threshold voltage to provide a desired reference current.

Even where a single reference level for normal reading is required, it can be advantageous to derive this as half the sum of the currents of two reference cells, one being adjusted to a maximum erased threshold voltage and the other being adjusted to a minimum programmed threshold voltage. The latter provides greater sensing margins when Vcc is greater than the minimum threshold voltage of a programmed cell, i.e. when programmed cells in the array begin to turn on.

After a program pulse has been applied to a cell to be programmed, the programming of that cell can be verified, with the dividing circuit disabled, by applying a voltage equivalent to the gate of the transistor of that cell to be programmed, and comparing the current passed by that cell with the current passed by a reference cell having a threshold voltage equal to the minimum threshold voltage of a programmed cell and having that same voltage applied to the gate of the transistor in the reference cell as to the cell being programmed. The magnitude of the applied voltage must be sufficient to generate adequate sensing current in the reference cell and is typically about 7 V.

Similarly, after an erase pulse has been applied to a cell to be erased, the erasure of that cell can be verified, with the dividing circuit disabled, by applying a voltage to the gate of the transistor of that cell to be erased, and comparing the current passed by a reference cell having a threshold voltage equal to the maximum threshold voltage of an erased cell and having that same voltage applied to the gate of the transistor in the reference cell as to the cell being erased. The magnitude of the applied voltage must be sufficient to generate adequate sensing current in the reference cell and is typically about 5 V.

The selection circuitry can comprise two stages, a main select stage and a subsidiary select stage. In that case, the selection circuitry can be arranged in the first branch of the first current mirror circuit and the second branch of the first current mirror circuit can include circuitry to provide a resistive match with said first and second stages of the selection circuitry. The resistive match circuitry can include identical devices laid out identically to render the match as good as possible.

The present invention also provides a sensing circuit for a memory comprising a plurality of memory cells, the sensing circuit including: a reference circuit comprising; at least one reference cell for generating a reference current in response to a control voltage; a first current mirror circuit connected to receive in a first branch thereof said reference current and to generate in the second branch thereof a first matched current; an output device connected to receive said first matched current and to supply a reference level derived from said first matched current; a reducing circuit for selectively reducing the reference level derived from said first matched current from a first full reference level to a second reduced reference level; said sensing circuit further comprising an input transistor connected in a current mirror configuration with said output device to produce a reference signal from said reference level; a sense amplifier having one input for receiving said reference signal and another input for receiving a signal from a selected one of said plurality of memory cells and an output for generating a sensed level dependent on the state of the differential between said reference signal and said signal from a selected one of said memory cells.

Preferably the sense amplifier is a dynamic sense amplifier. The invention is also applicable however to providing a reference level for static sense amplifiers.

The reference circuit can also include a fast precharge circuit for quickly precharging the reference level before a sense operation. This is particularly useful where there are a plurality of sense amplifiers to which the reference level is routed which increases the capacitance connected to the reference level.

For a better understanding of the present invention and to show how the same may be carried into effect, reference will now be made by way of example to the accompanying drawings.

BRIEF DESCRIPTION OF THE DRAWINGS

FIG. 3 illustrates in tabular form the signals applied to various cells within the flash memory array during operation;

DESCRIPTION OF THE PREFERRED EMBODIMENTS

Figure 1:
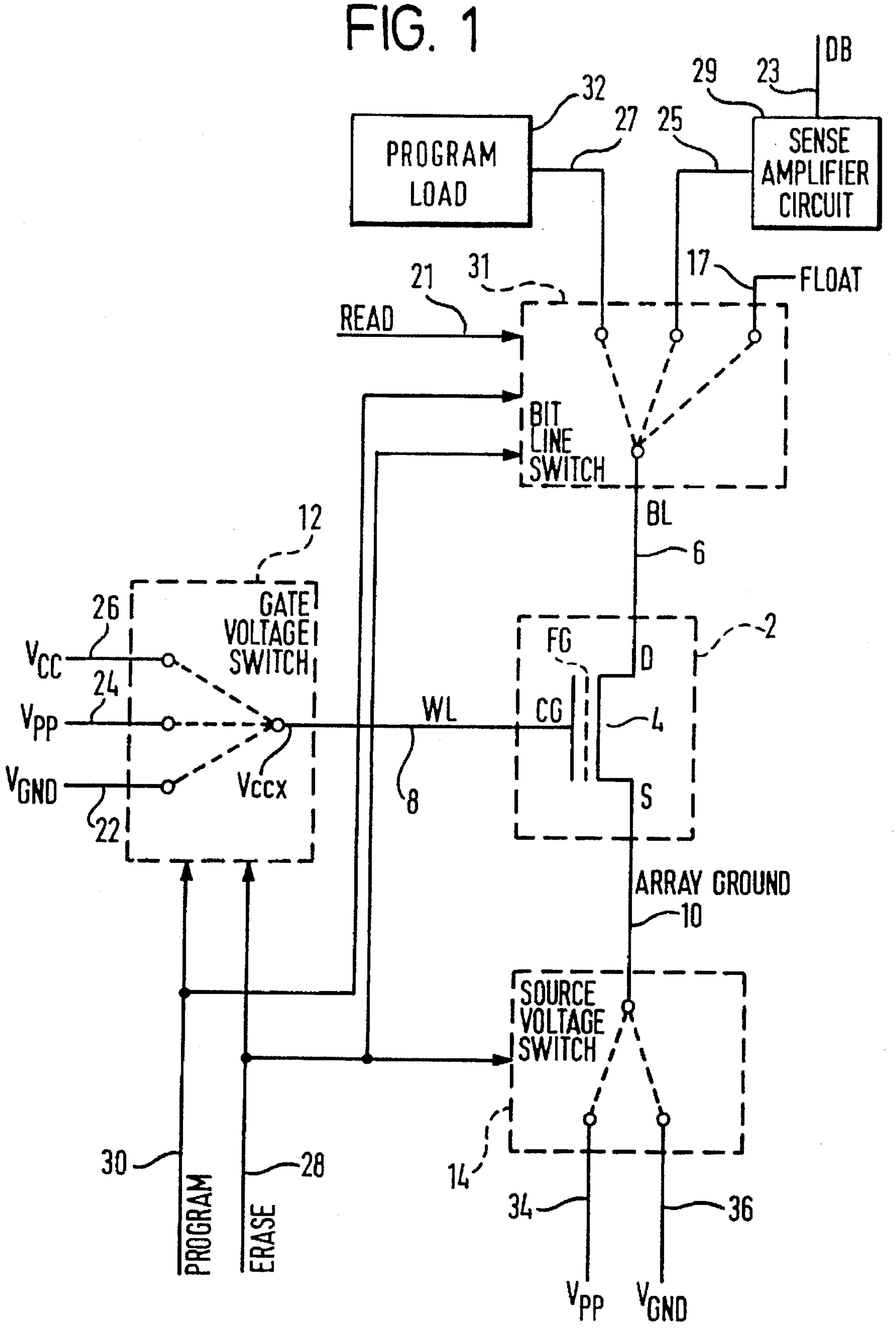
FIG. 1 is an illustrative example of a basic flash memory cell showing the different signal levels which can be applied to the cell.

FIG. 1 illustrates a flash memory cell 2 comprising a single floating gate transistor 4 having a control gate CG, a floating gate FG, a source S, and a drain D. The source S of the floating gate transistor 4 is connected to an ARRAY GROUND signal on line 10. Through a source voltage switch circuit 14 this line 10 can be at a ground voltage VGND or a high voltage Vpp. Voltage Vpp represents a programming potential (typically 12 V) and voltage VGND represents device ground. Vpp is normally connected to array ground, either directly or via a resistor (not shown). The source voltage switch 14 is connected to the voltage Vpp via line 34 and the voltage VGND via line 36. The control gate CG of the floating gate transistor 4 is connected to the output Vccx of a gate voltage switch 12 by a word line (WL) 8. The gate voltage switch 12 is further connected to voltages Vcc, Vpp and VGND on lines 26, 24 and 22, respectively. Vcc is at 5 V for a 5 V part or 3 V for a 3 V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch further connected to the output of a program load 32 on write line 27, the input of a sense amplifier circuit 29 on read line 25, and a floating connection FLOAT on line 17. It will be appreciated that in an array a plurality b of selected bit lines may simultaneously be connected to the sense amplifier circuit 29 during a read operation so that line 25 will be normally implemented as b lines. Similarly, during a program operation a plurality b of selected bit lines may simultaneously be connected to the program load 32, so that line 27 will also normally be implemented a b lines. In the described embodiment b=8. The switch 31 receives a control signal READ on line 21, in addition to the control signals PROGRAM and ERASE on lines 30 and 28, respectively.

The flash memory has three primary modes of operation: program, erase and read. Each of these modes will be described hereinafter with reference to FIG. 1. It will be understood by a person skilled in the art that several other modes of operation such as program verify for example, also exist. However, the present description is by way of background illustration only and therefore only these three modes will be described. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e. contains either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The big line switch 31 is set such that the bit line on line 6 is connected to the program load 32 by line 27. The program load is such that a voltage of between 4 and 8 V is on the drain D of the transistor 4 via the bit line 6. As a result of these signals applied to the transistor 4 the floating gate FG becomes negatively charged. The negative charge increases the threshold voltage of the floating gate transistor making it less conductive. The amount of negative charge accumulated at the floating gate depends on several factors, including the duration for which the control signal PROGRAM is set, the voltages applied to the gate and drain terminals, and the thickness of the oxide separating the floating gate from the channel of the transistor. Furthermore, as the cell is programmed the accumulation of negative charge on the floating gate causes the electric field across the field oxide to reduce such that a point is reached where no more negative charge is attracted to the floating gate such that the threshold voltage of the floating gate transistor saturates to a limit. In this way, a "0" is written into the cell. Normally, several program pulses may be needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The bit line switch 31 is set such that the bit line 6 is connected to the floating connection FLOAT on line 17 so that it floats. As the floating gate transistor is fabricated such that the source region in the substrate underlies the floating gate, any negative charge on the floating gate will be reduced. The amount of negative charge removed from the floating gate FG depends on the various factors as discussed above with reference to the program operation. The reduction of negative charge reduces the threshold voltage of the floating gate transistor making it more conductive. In this way the state of the cell is restored to "1". Normally, several erase pulses may be required, each erase pulse being followed by a verify cycle.

During a read mode, neither the control signal ERASE on line 28 nor the control signal PROGRAM on line 30 are set but the READ signal on line 21 is set. The Vcc signal on line 26 is connected by the source voltage switch 12 to the control gate of the transistor 4 via the line Vccx and the word line 8. Where Vcc is 3 V, the wordline is boosted to about 5 V for a read operation. The voltage VGND on line 36 is connected to the source of the transistor 4 via the ARRAY GROUND signal line 10. The bit line 6 is biased to approximately 1 volt during a read operation by a bit line load within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current passed (or not) by the cell is compared with a reference current to detect the status of the cell, as described in more detail in the following.

The operation of a flash cell in a memory array will now be described with reference to FIG. 2. Signal lines or circuitry common to FIG. 1 can be identified in FIG. 2 by use of the same reference numerals. Voltage supplies have not been illustrated in FIG. 2 for reasons of clarity, but it will be understood with reference to FIG. 1 which voltages are required in various parts of the circuit.

Figure 2:
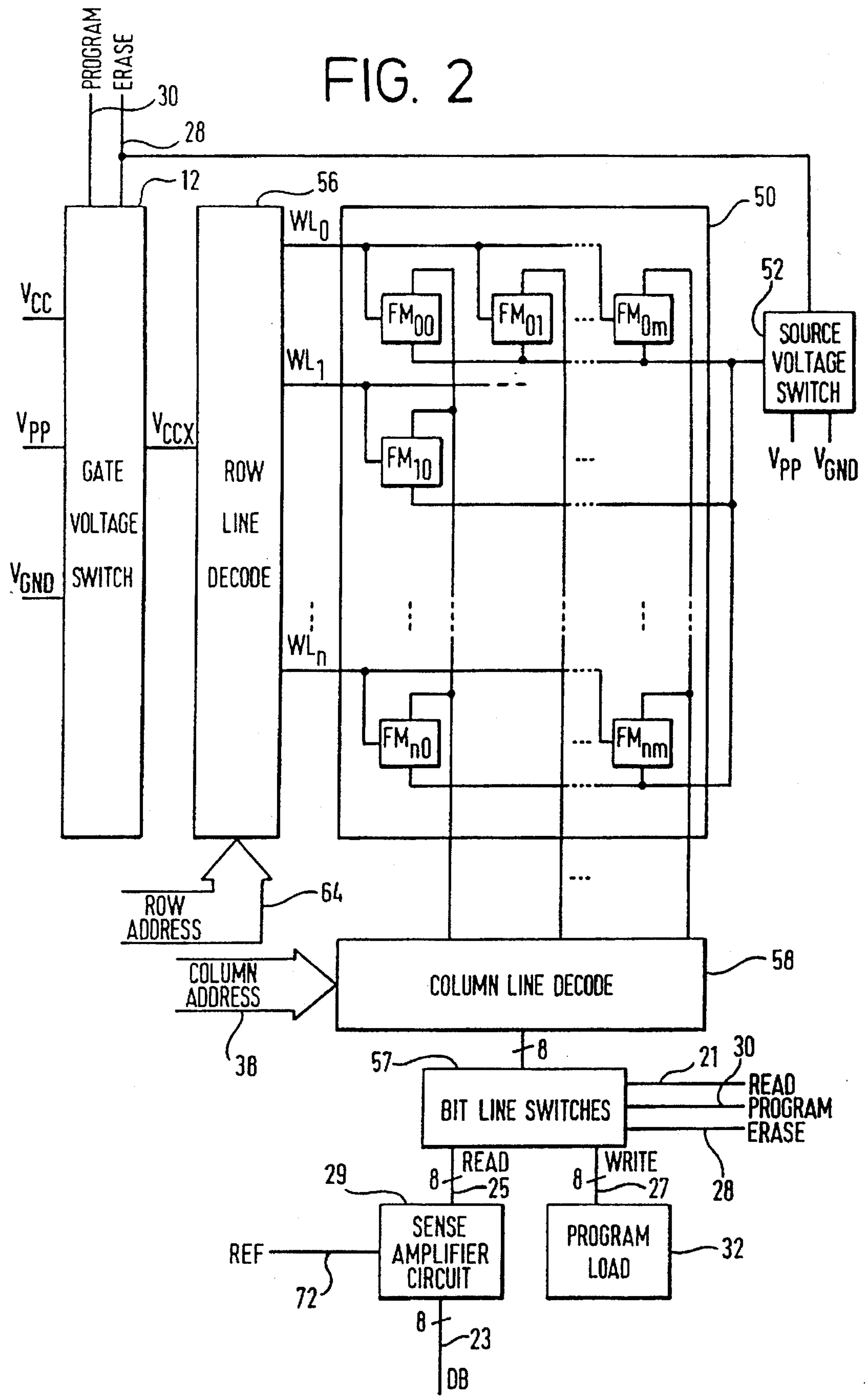
FIG. 2 is an illustrative block diagram of the overall structure of a flash memory array.

FIG. 2 illustrates a flash memory array 50 comprising a plurality of flash memory cells FMoo . . . FMnm, arranged in rows and columns, each of which can be the same as the cell 2 shown in FIG. 1. The gates of the transistors in each memory cell in a row are commonly connected to a respective word line WLo . . . WLn addressable by a row line decode circuit 56 which receives the row address 64. The gate voltage switch 12 responds to the control signals PROGRAM and ERASE on line 30 and 28 respectively, and supplies the appropriate gate voltage Vccx to be switched to the addressed wordline through the row line decode circuit 56.

The drains of each transistor in a column are commonly connected by bit lines BLo . . . BLm to a column line decode circuit 58. The column line decode circuit selects a plurality b (in this example, b=8) of the bit lines BLo to BLm to be connected to a plurality b of bit lines switches 31 as shown in FIG. 2 as a block of bit line switches 57. Therefore eight of the m bit lines BLo . . . BLm are selected by the column address 38 to be connected to the eight bit line switch circuits. The outputs of the bit line switches 57 on line 25 is a read output and is connected to the sense amplifier circuit 29. The sense amplifier circuit 29 contains a plurality of sense amplifiers (eight in the described embodiment to allow eight bits to be read in a common cycle), and hence the output on line 25 is actually a plurality of bits wide (eight in the described example). The bit line switches receive a write input on line 27 from the program load 32. During a program operation eight of the bit lines BLo to BLm are selectively connected to the program load 32.

The program load 32 similarly comprises a plurality (in this example eight) of program loads, and hence the input on line 27 is actually also eight bits wide. During a read operation the selected bit line (or bit lines) are connected to the sense amplifier circuit 29. The sense amplifier circuit 29 also receives a reference signal REF on line 72 and generates output signals on the data bus (DB) 23, which is an eight bit bus in the described embodiment. The respective output signals are generated by comparing the signals on the respective bit lines with the reference signal REF.

It will be appreciated that when a particular cell is chosen to be programmed, the program load will only be applied to a selected column so that other cells in the same row as the selected cells are not inadvertently programmed. Unselected columns are clamped to ground to avoid coupling from neighbouring selected bit lines. The signals existing on the various nodes of cells in an array for various operations are summarised in FIG. 3. In FIG. 3 the drain voltage (D), gate voltage (CG) and source voltage (S) correspond to points shown in flash memory cell 2 of FIG. 1. $V_{PP}$ and $V_{GND}$ in FIG. 3 correspond to $V_{PP}$ and $V_{GND}$ shown in FIG. 1 and FIG. 2, and described in the description of FIG. 1. During an erase operation every cell in the memory array is erased, although it will be appreciated by a person skilled in the art that an array could be split into sectors for erasing so that only part of the array is erased at any one time. During an erase operation the bit lines are allowed to float to reduce stress across the source/drain terminals since the sources are taken to a very high voltage.

When the sense amplifier circuit 29 is a current sensing sense amplifier, the reference signal REF on line 72 will be a current reference signal. However, there is a problem if the capacitance associated with the source for the current reference signal REF differs significantly from the capacitance of the bit line to which the selected cell is connected, since capacitive balancing is needed for good sensing. However, this is not simple to achieve in a single transistor flash EPROM. As each cell contains only one transistor, it is not possible to use a folded bit line scheme as is implemented commonly on dynamic random access memories (DRAMS). Furthermore, although in principle eight dummy bit lines could be used in association with each active bit line per column, this would increase the required space in the layout and make the chip much larger. The advantages of dynamic sense amplifiers have not been realised until now due to many design criteria which need to be addressed, e.g. capacitive input balancing, device matching, sensing integrity, the need to reduce noise on the inputs to a minimum etc.

Figure 4:
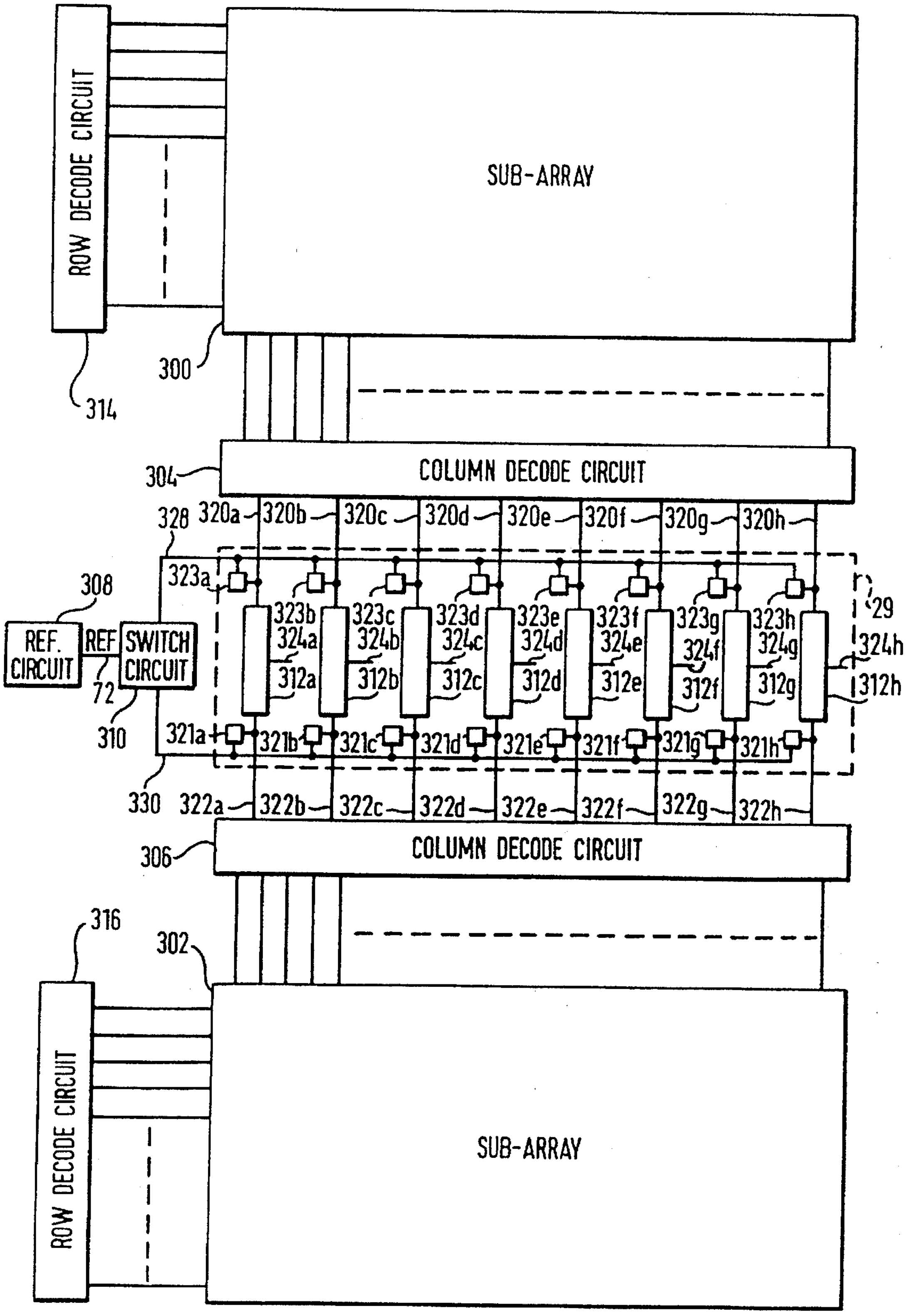
FIG. 4 is a schematic diagram of the overall structure of a flash memory array in which the present invention may be implemented.

FIG. 4 illustrates diagrammatically part of a memory structure which allows a dynamic current sense amplifier to be implemented. The memory of FIG. 4 has two sub-arrays, a first sub-array 300 and a second sub-array 302. Each of the sub-arrays may be similar to the array 50 of FIG. 2, having n rows and m columns. The gate voltage switch 12, source voltage switch 52 and programmable load circuit 32 of FIG. 2 have been omitted from FIG. 4 for reasons of clarity, but it should be noted that the distribution of such circuitry will be dependent upon the particular implementation. It may be possible for the present invention to be implemented in memories having different architectures.

The first sub-array 300 has an associated first row decode circuit 314 and an associated first column decode circuit 304. The second sub-array 302 has an associated second row decode circuit 316 and an associated second column decode circuit 306. The respective row decode circuits drive the n wordlines of the respective arrays. The addressing and control circuitry for the row decode circuits is not shown for reasons of clarity. The respective column decode circuits address the bidirectional m column lines of the respective arrays. Similarly, the addressing and control circuitry for the column decode circuits is not shown for reasons of clarity. The memory structure also comprises a sense amplifier circuit 29 containing eight sense amplifiers **312*a* to 312*h*, a switch circuit 310, and a reference circuit 308. Each sense amplifier 312***a* to 312*h* receives an input from a respective one of a first set of read lines 320*a* to 320*h* from the first column decode circuit 304, and an input from a respective one of a second set of read lines 322*a* to 322*h* from the second column decode circuit 306. Each sense amplifier 312*a* to 312*h* generates an output on a respective data line 324*a* to 324*h*. The switch circuit 310 receives as an input the reference signal REF on line 72 from the reference circuit 308.

The switch circuit 310 selectively connects the reference signal REF to a first output line 328 which is commonly connected to one terminal of a set of switches 323*a* to 323*h*. Each of the switches has a respective second terminal connected to a respective one of the read lines 320*a* to 320*h*. The switch circuit 310 also selectively connects the reference signal REF to a second output line 330 which is connected to one terminal of a set of switches 321*a* to 321*h*. Each of the switches has a respective other terminal connected to a respective one of the read lines 322*a* to 322*h*. The switch circuit 310 and the switches 321*a* to 321*h* and 323*a* to 323*h* are selectively controlled such that when the signal REF is applied to the line 328 all the switches 321*a* to 321*h* are open and all the switches 323*a* to 323*h* connect the signal REF on line 328 to the respective read lines 320*a* to 320*h*. Conversely, when the signal REF is applied to the line 330 all the switches 323*a* to 323*h* are open and all the switches 321*a* to 321*h* connect the signal REF on line 330 to the respective read lines 322*a* to 322*h*.

Each array 300 and 302 is an active array, not a "dummy" array, i.e. each array contains addressable memory cells storing data bits. However, the row decode circuits 314 and 316 are independently addressable so that when a wordline in the first array 300 is selected, no wordline in the second array 302 is selected and vice versa.

The column decode circuits 304 and 306 can be commonly addressed so as to connect the sense amplifiers 312*a* to 312*h* to the bit lines associated with the addressed memory cells in one of the first and second arrays 300 and 302 and the corresponding bit lines (on which no cells are addressed) in the other of the first and second arrays 300 and 302. The column decode circuit 304 connects eight of the m bit lines of the first array 300 to the read lines 320*a* to 320*h*, and the column decode circuit connects the corresponding eight of the m bit lines of the second array 302 to the read lines 322*a* to 322*h*. The "corresponding bit line" in this context means the bit line which is vertically. below (or above, as the case may be) the bit line connected to the addressed memory cell, i.e. the bit line in the other sub-array having the same column address as the addressed memory cell.

As explained above, each sense amplifier compares the signal on the bit line of the addressed cell with the reference signal REF from the reference circuit 308.

For an addressed memory cell in the first array 300, the cells connected to the corresponding bit line of the second array 302, which are connected through the column decode circuit 306 to the same sense amplifier as is connected to the bit line of the addressed cell provide a perfect capacitive match for sensing. The reference circuit 308 is connected via the switch 310 to provide the current reference signal REF on line 72 to the corresponding bit line in the second array 302, that is the bit line on which no cells have been addressed.

It should be apparent from the above description that only one of the two arrays has a wordline activated although the column decode circuits 304 and 306 associated with each array are activated. Depending on whether the addressed cell is erased or programmed, it may draw a current from its bit line. If the cell is erased, a current flows, while if it is programmed substantially no current flows. No current flows in the corresponding bit line because no wordline is selected (all are grounded).

The reference circuit 308 generates a reference current which, in combination with the switches 323*a* to 323*h* or the switches 321*a* to 321*h*, is mirrored onto each of either the first or second inputs respectively of each of the sense amplifiers 312*a* to 312*h*.

As can be seen, in the above arrangement the capacitance associated with the respective two inputs of the sense amplifiers 312*a* to 312*h* is balanced, because there are an equal number of memory cells attached to each bit line. Therefore, depending on whether the addressed cell in the addressed array is programmed or erased, the difference in the currents drawn from the two inputs of the sense amplifier will cause a small voltage difference which can be sensed by the sense amplifier. Any on-chip noise (for example due to coupling within the column decode circuitry) will affect both bit lines equally. The sense amplifier relies on differential sensing and this noise will be common mode.

Figure 5:
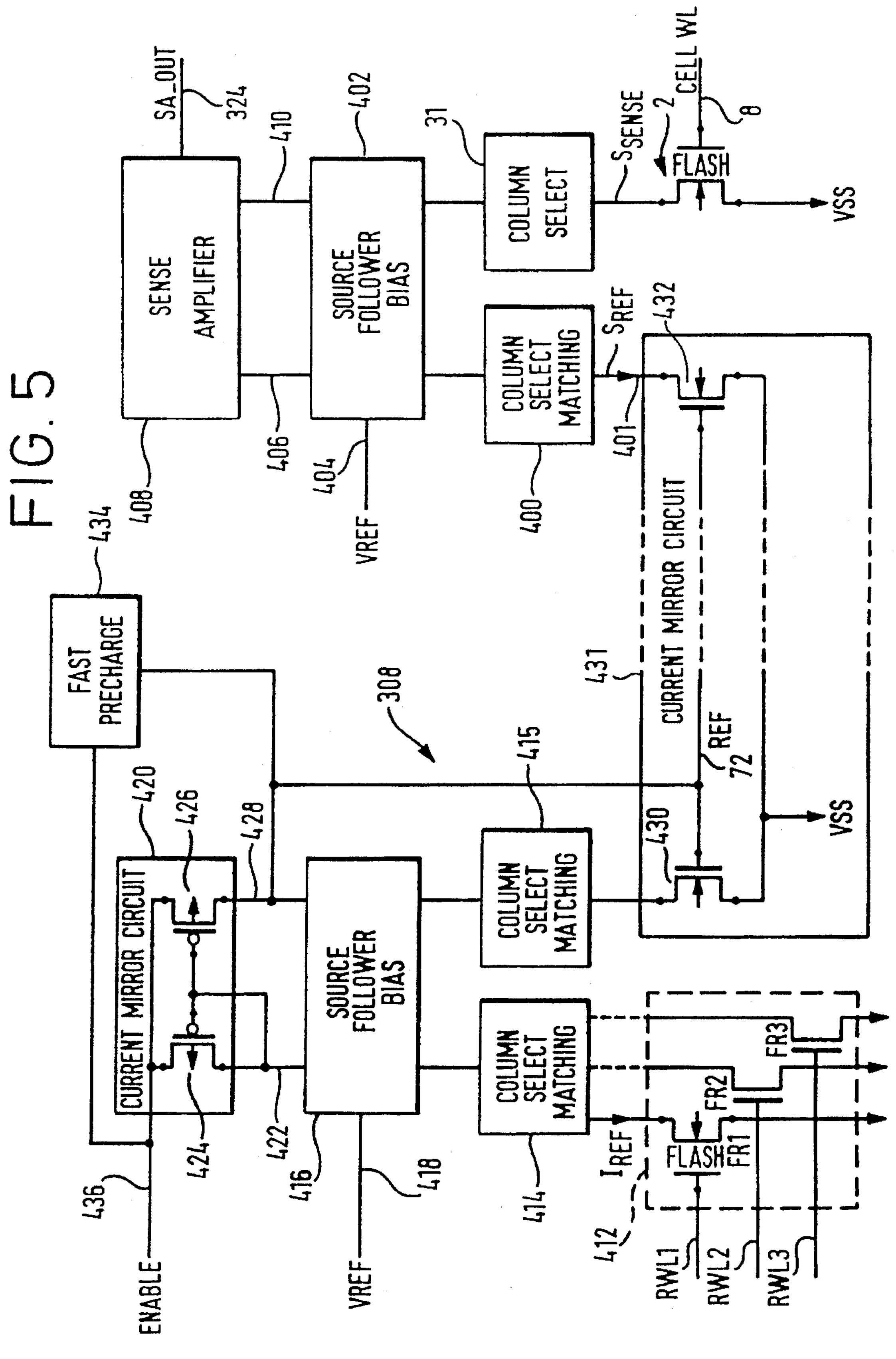
FIG. 5 is a block diagram of a current reference circuit.

FIG. 5 is a block diagram of circuitry including a reference circuit according to one embodiment of the invention used to implement the reference circuit 308 of FIG. 4. The reference circuit provides a reference level marked REF on line 72. In FIG. 5 reference numeral 2 denotes (as in FIG. 1) a flash memory cell which has been selected for sensing. The switch circuit 310 has been omitted from FIG. 5 for the sake of clarity. The remaining blocks on the right hand side of FIG. 5 illustrate the main components of a sense amplifier circuit 312 with the column select switch 31 which forms part of the column decode circuit 304 (or 306) of FIG. 4. In FIG. 5, reference numeral 400 denotes a column select match circuit which is provided to match the resistance of the column select switch 31. The circuit also includes a source follower bias circuit 402 controlled by a control voltage Vref on line 404. The column select circuit 31 and column match circuit 400 are connected to respective inputs of the source follower bias circuit 402. A reference signal Sref on line 401 derived from the reference level REF on line 72 is passed to one input 406 of a sense amplifier 408 via the source follower bias circuit 402. The signal S sense from the selected memory cell 2 which is to be sensed is passed to a second input 410 of the sense amplifier 408 via the source follower bias circuit 402. The sensed signal is output on line 324 as the signal SA-OUT. A more detailed explanation of the construction and operation of the sensing circuit on the right hand side of FIG. 5 is given in our copending U.S. application Ser. No. 08/559,305 entitled "Dynamic Sense Amplifier" (Page White & Fatter Ref. 76218), the contents of which are herein incorporated by reference.

FIG. 5 also shows the elements of the current reference circuit 308. The reference circuit includes a plurality of flash reference cells indicated diagrammatically within the broken line denoting a reference block 412. In the example shown in FIG. 5 each of the plurality of flash reference cells FR1,FR2,FR3 has a respective reference wordline RWL1, RWL1,RWL3 for controlling the gate of the respective flash reference cell. In an alternative arrangement, the flash reference cells may have a common wordline. If the reference circuit 308 is only required to produce a reference level REF for reading data stored in a selected memory cell, in principle, only one flash reference cell is required. However, as is apparent from the following description, it is highly advantageous to have more than one reference cell. With a plurality of cells, each of the cells has a threshold voltage $V_{TH}$ selected to produce a reference current when their gate voltage on a respective one of the lines RWL1,RWL2,RWL3 is at an appropriate level to turn on the respective cell to provide adequate cell current for sensing. In FIG. 5, three cells are indicated, including reference transistors which are identical to memory cells of the array, but with threshold voltages adjusted to represent a maximum erased threshold voltage and a minimum programmed threshold voltage. However, it will readily be appreciated that any appropriate number of cells can be used as required depending on the number of different reference levels to be provided. As will be understood from the foregoing explanation, a different reference level on line 72 is required for different operations of the memory. The required gate voltages (as explained above) are applied to the reference transistors in the reference block 412 via the respective reference wordlines. The appropriate gate voltages are applied to the selected memory cell 2 via the wordline 8.

For reading a data bit stored in a selected memory cell 2, the reference current is set at half the sum of the current passed by a normal programmed cell and the current passed by a normal erased cell by a divide-by-two circuit 460 (omitted from FIG. 5 for clarity). The level for reading is referred to herein as a so-called "normal reading" level. However, it will be apparent from the foregoing description that during programming and erase operations, data is verified after each program or erase pulse. This is done by "reading" the data from the selected memory cell 2 by comparing the current passed by the cell with a reference level compatible with the programming or erase levels generated using the maximum erased threshold voltage or the minimum programmed threshold voltage as described hereinabove. For this reason also, the reference transistors in the reference block 412 have different threshold voltages $V_{TH}$.

After a program pulse has been applied to a cell to be programmed, the programming of that cell can be verified, with the dividing circuit disabled, by applying a voltage equivalent to the gate of the transistor of that cell to be programmed, and comparing the current passed by that cell with the current passed by a reference cell having a threshold voltage equal to the minimum threshold voltage of a programmed cell and having that same voltage applied to the gate of the transistor in the reference cell as to the cell being programmed. The magnitude of the applied voltage must be sufficient to generate adequate sensing current in the reference cell and is typically about 7 V. If the current passed by the cell being programmed is greater than that passed by the reference cell, then the cell being programmed will need to be subjected to additional program pulses followed by additional program verify operations. If, however, the current passed by the cell being programmed is less than that passed by the reference cell, the cell being programmed is verified as programmed.

Similarly, after an erase pulse has been applied to a cell to be erased, the erasure of that cell can be verified, with the dividing circuit disabled, by applying a voltage to the gate of the transistor of that cell to be erased, and comparing the current passed by a reference cell having a threshold voltage equal to the maximum threshold voltage of an erased cell and having that same voltage applied to the gate of the transistor in the reference cell as to the cell being erased. If the current passed by the cell being erased is less than that passed by the reference cell, then the cell being programmed will need to be subjected to additional erase pulses followed by additional erase verify operations. If, however, the current passed by the cell being erased is more than that passed by the reference cell, the cell being erased is verified as erased. The magnitude of the applied voltage must be sufficient to generate adequate sensing current in the reference cell and is typically about 5 V.

Figure 7:
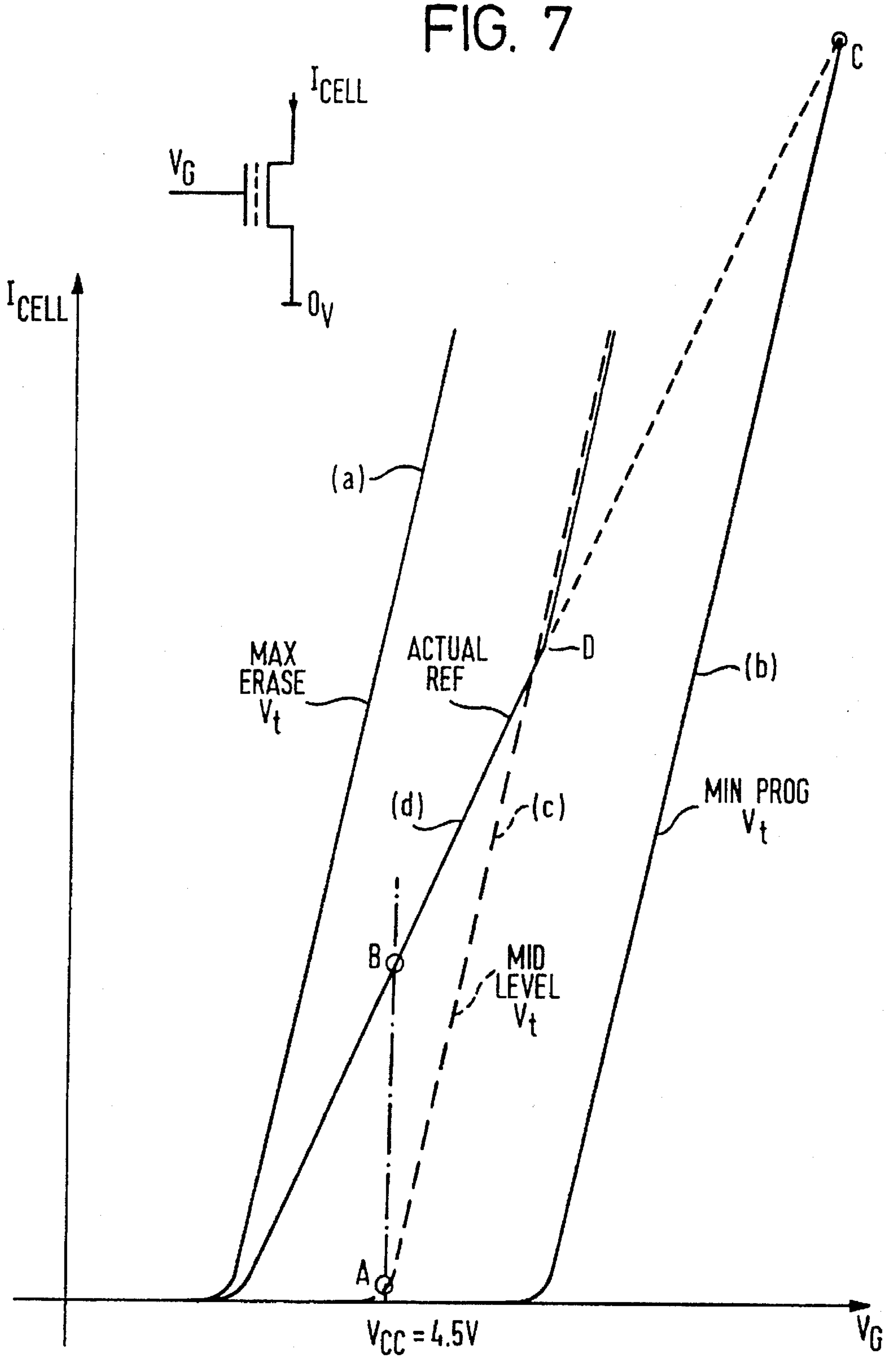
FIG. 7 is a graph showing selection of reference cells for the reference circuit.

FIG. 7 is a graph of the current drawn by a flash reference cell against the gate voltage applied to the gate of the cell. The cell current versus the gate voltages are shown for an erased cell, a programmed cell and a cell having a threshold value selected midway between the two. Curve (a) is the curve for an erased cell (MAX ERASE $V_t$), curve (b) is the curve for a programmed cell (MIN PROG $V_t$) and curve (c) is the curve for a mid-level cell (MID LEVEL $V_t$). Firstly, FIG. 7 illustrates that the provision of a so-called mid-level cell would not be useful because for a gate voltage of for example 4.5 V practically no current would be supplied. This is illustrated by point A on the mid-level curve (c). Curve (d) is the actual reference level (ACTUAL REF). The slope of curve (d) is half the normal slope due to the divide-by-two circuit until the programmed cell turns on (curve (b)), in which case the slope becomes the same as the normal slope. This change in slope is shown at point D in FIG. 7 on curve (d). It can readily be seen that on curve (d), there is ample current for sensing at point B at a gate voltage of 4.5 V. It will readily be apparent that reference block 412 includes at least transistors having threshold voltages to give curves (a) and (b).

FIG. 7 also illustrates why it is advisable to use both an erased cell and a programmed cell in the reference circuit. If a programmed cell were not used, curve (d) would continue along line DC and would intersect the programmed cell line (b) at point C. For gate voltages greater than the value of the gate voltage at point C, a programmed cell would be sensed as an erased cell. In practice this point is well above 5 V, the normally expected gate voltage for the reference cells. However, it can be desirable to provide more sense margin as the power supply voltage increases.

During an erase operation, erase verify steps are required which utilise the erase reference cell line (a) as the reference, with the divide-by-two circuit disabled. During this verify operation, cells with a smaller threshold voltage are passed and a further erase operation is performed if any cells fail. Similarly, during a programming operation, a program verify step is carried out with the reference current for the sense amplifier provided by the programmed cell line (b), again with the divide-by-two circuit disabled. Cells with a greater threshold voltage are passed and a further program operation is performed on cells which fail.

Referring again to FIG. 5, selection between the reference transistors in block 412 is carried out by a reference column select circuit 414 in addition to selection of different wordlines RWL1,RWL2,RWL3 associated with the respective reference transistors. If there is only one reference transistor, then no reference column select is required. There must however still be a circuit to match the resistance with the column select circuit 31 and column select match circuit 400. The reference circuit 308 includes a source follower bias circuit 416 controlled by a control voltage Vref on line 418. It will readily be appreciated that the control voltage Vref on line 404 and the control voltage Vref on line 418 must be the same voltage, and use of a common signal guarantees this. The reference circuit also includes a current mirror circuit 420. The reference signal Iref taken from the selected reference transistor from reference block 412, selected via the column select circuit 414 is supplied through the sounce follower bias circuit 416 to one input 422 of the current mirror circuit. That input 422 is connected to a diode connected p-channel transistor 424. The gate of the diode connected p-channel transistor 424 is connected to the gate of a further p-channel transistor 426. As will readily be apparent, the p-channel transistors 424, 426 are maintained in saturation so that the current in transistor 424 is mirrored into transistor 426. This current flows through transistor 430 of current mirror 431 via the source follower bias circuit 416 and the reference column select match circuit 415. The current through the output transistor 430 is mirrored to a plurality of transistors connected in a current mirror configuration with output transistor 430 of current mirror 431, only one of which 432 is illustrated in FIG. 5, via the reference level REF. It will be appreciated that there will be a transistor 432 associated with each sense amplifier circuit 312*a* to 312*h* in FIG. 4. To form a current mirror between transistors 430 and 432 would normally require a diode connection of transistor 430. However this is not required in the present case because the bias voltages on the drains of the n-channel transistors 430 and 432 are maintained at the same level by the source follower bias circuits 416 and 402. In the circuit of FIG. 5 it can readily be seen that the reference current Iref from the selected reference cell from block 412 is mirrored onto the drain of output transistor 430 and from there onto the drain of current mirror transistor 432 for use as a reference signal Sref in each sense amplifier circuit.

Further, by connecting the gate of the output transistor 430 back to the first branch 428 of the current mirror circuit provides advantages in the speed of power-up of the circuit due to feedback.

The circuit of FIG. 5 also includes a fast precharge circuit 434 controlled in response to an enable signal ENABLE on line 436.

Figure 6:
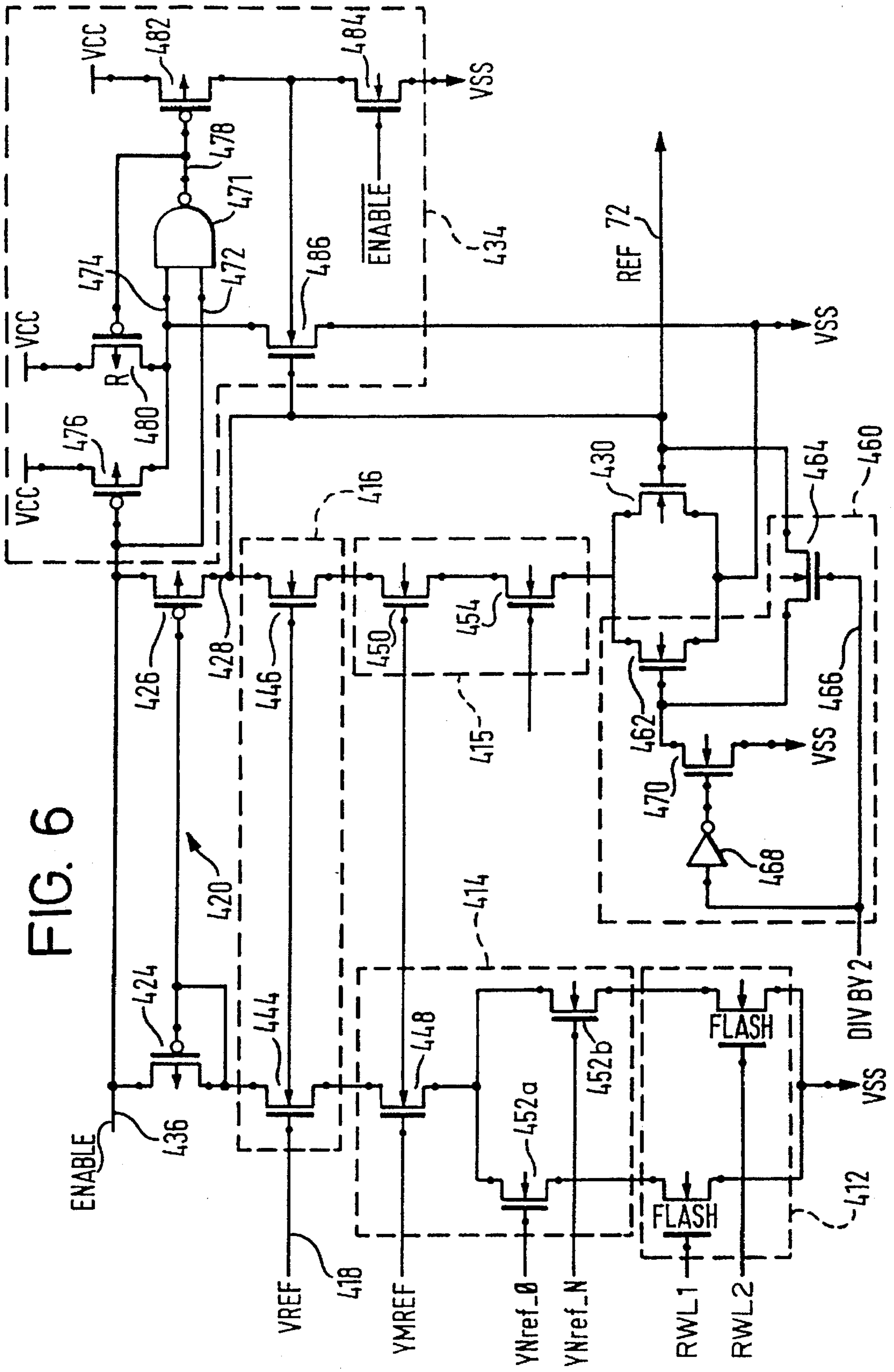
FIG. 6 shows a transistor level implementation of the current reference circuit of FIG. 5.

FIG. 6 shows a transistor level implementation of the reference circuit 308 of FIG. 5. As can be seen from FIG. 6, the source follower bias circuit 416 comprises first and second n-channel transistors 444,446 having their gates connected to receive the control voltage Vref on line 418 and connected respectively to the diode connected transistor 424 and the transistor 426 of the current mirror circuit 420. The column select circuit 414 comprises a main select transistor 448 which is connected to the transistor 444 of the source follower bias circuit 416 and which is selected by a main select signal YMref on its gate. The main select transistor 448 is connected to a plurality of subsidiary select transistors 452*a* and 452*b*, which are individually selectable by select signals $YNref__{o}$ . . . $YNref_{n}$ on, their gates. The number of subsidiary select transistors 452*a* and 452*b* is equal to the number of reference flash cells in the reference block 412. It will be appreciated that the terms "main" and "subsidiary" do not imply that the subsidiary stage is unnecessary or any less important than the main stage. In FIG. 6, two reference cells are shown with two associated subsidiary select transistors 452. The reference column select match circuit 415 includes a main balancing transistor 450 and a subsidiary balancing transistor 454. FIG. 6 illustrates the output transistor 430 connected to the subsidiary balancing transistor 454. FIG. 6 also illustrates the divide-by-two circuit 460 which is not shown in FIG. 5. This divide-by-two circuit 460 includes an n-channel transistor 462 matched to the output transistor 430 and connected in parallel with it. The divide-by-two circuit 460 also includes a control transistor 464 which is an n-channel transistors having its gate connected to receive a divide-by-two signal (DIV BY 2) on line 466 and its source/drain path connected between the gates of the output transistor 430 and its paired transistor 462. The divide-by-two circuit 460 also includes an inverter 468 which receives the divide-by-two signal on line 466 and which is connected to supply its output to a pull-down transistor 470 which is an n-channel transistor having its source/drain path connected between the gate of the paired transistor 462 and ground Vss. When the divide-by-two signal on line 466 is high, the control transistor 464 is turned on and thus ties together the gate voltages of the output transistor 430 and the paired transistor 462. Thus, both transistors 430 and 462 are on and so the current in the mirrored leg of the reference circuit is divided by two, half being taken through output transistor 430 and half through the paired transistor 462. Thus, the reference level on line 72 is modulated in accordance with the current through the output transistor 430 being halved. In this situation, the pull-down transistor 470 is turned off. When the divide-by-two signal on line 466 is low, the control transistor 464 is turned off. Furthermore, the pull-down transistor 470 is turned on thus pulling down the gate of the paired transistor 462 and holding it off. In that situation, all of the current from the column select circuit 414 is supplied through the output transistor 430 and the reference level on line 72 rises accordingly.

FIG. 6 also shows the implementation of the fast precharge circuit 434. The fast precharge circuit includes a NAND gate 471. A first input 472 of the NAND gate is connected to receive the ENABLE signal on line 436. A second input 474 of the NAND gate 471 is connected to the drain of a p-channel transistor 476, the gate of which is connected to receive the ENABLE signal and the source of which is connected to a supply voltage Vcc. The output 478 of the NAND gate is connected to the gate of a second p-channel transistor 480 which likewise has its drain connected to the second input 474 of the NAND gate 471 and its source connected to the supply voltage Vcc. The output of the NAND gate 471 is also connected to the gate of a third p-channel transistor 482 which has its drain connected to an n-channel transistor 484 and its source connected to the supply voltage Vcc. The n-channel transistor 484 has its source connected to GROUND Vss, its drain connected to the third p-channel transistor 482 and has its gate connected to receive the inverted version of the ENABLE signal, $\overline{ENABLE}$. The n-channel transistor 484 also has its drain connected to the output 428 of the current mirror circuit 420 and hence the signal REF on line 72. The fast precharge circuit 434 also includes an n-channel transistor 486 which has its gate connected to the output 428 of the current mirror circuit 420 which in turn is connected to the signal REF on line 72, and its source/drain path connected between GROUND Vss and the second input 474 of the NAND gate 471.

Before the circuit of FIG. 6 is enabled, there is no voltage supply to the circuit and the signal ENABLE is low. The signal ENABLE being low causes the transistor 484 to turn on (since this is controlled by the inverse of the signal ENABLE) and hence the line 428, and consequently the signal REF on line 72, is tied to ground. The signal ENABLE being low forces the output of the NAND gate 471 high, and therefore the second p-channel transistor 480 and third p-channel transistor 482 are both off. The second p-channel transistor 480 is a weak feedback device and the third p-channel transistor 482 is the precharge device. The p-channel transistor 476 is on and hence the second input 474 of the NAND gate 471 is high.

When the circuit is enabled by the signal ENABLE going high, the n-channel transistor 484 turns off releasing the signal REF on line 72. The signal ENABLE going high causes the first input 472 to the NAND gate 471 to go high such that both inputs of the NAND gate are high, and hence the output of the NAND gate goes low and the precharge p-channel transistor 482 turns on. The p-channel precharge transistor is fairly large so that it can pull the signal REF on line 72 up quickly. P-channel transistor 480 holds the second input 474 of the NAND gate 471 high at this stage. Once the signal REF has risen to a sufficient level to turn the n-channel transistor 486 on, the action of-this n-channel transistor will start to pull the second input 474 of the NAND gate 471 towards ground. The n-channel transistor 486 will be large enough to overcome the action of the p-channel transistor 480. After a time dependent on the relative sizes of the transistors 486 and 480 the second input 474 of the NAND gate 471 will fall to a sufficiently low level to cause the output of the NAND gate to go high, thus turning off the p-channel transistor 482. In this manner, the signal REF is subjected to a precharge pulse. The feedback in this circuit is preferably optimised to precharge the signal REF on line 72 to about 1.5 V, which is approximately its final value.

If there was not a fast precharge circuit such as that described hereinabove, the signal REF would rise slowly to its final value of approximately 1.5 V because of the low current through the cell devices. The signal VREF could also be fast precharged by a similar circuit to that described hereinabove. Such an additional circuit, in conjunction with the precharge circuit described hereinabove precharging the output node 428 of the current mirror circuit, would result in the whole reference circuit being driven to its final state quickly, which is desirable for a fast memory access time.

What is claimed is:

1. A reference circuit comprising:

at least one reference cell for generating a reference current in response to a control voltage;

a first current mirror circuit connected to receive in a first branch thereof said reference current and to generate in a second branch thereof a first matched current;

an output device connected to receive said first matched current and to supply a reference level derived from said first matched current;

a dividing circuits for selectively reducing the reference level derived from said first matched current from a first, full reference level to a second, reduced reference level.

2. A reference circuit according to claim 1 wherein the dividing circuit is a divide-by-two circuit for generating a second, reduced reference level which is half the first, full reference level.

3. A reference circuit according to claim 2 wherein the output device comprises an output transistor and wherein the dividing circuit comprises a transistor connected in parallel to said output transistor and a control transistor having a controllable path connected between control terminals of said transistor connected in parallel to said output transistor and the output transistor, the control transistor having a control terminal connected to receive a reducing signal whereby half the first matched current flows through the output transistor and half through said transistor connected in parallel to said output transistor when the control terminal of said control transistor receives said reducing signal.

4. A reference circuit according to claim 1 wherein the reference cell is a single transistor floating gate cell.

5. A reference circuit according to claim 1 which comprises a plurality of reference cells operable to generate different reference currents and selection circuitry for selecting a desired one of said reference cells.

6. A reference circuit according to claim 4 which comprises a plurality of reference cells operable to generate different reference currents and selection circuitry for selecting a desired one of said reference cells, wherein said reference cells have different threshold voltages.

7. A reference circuit according to claim 5 wherein said selection circuitry comprises a main selection stage and a subsidiary selection stage.

8. A reference circuit according to claim 1 which comprises bias circuitry for biasing said first current mirror circuit.

9. A reference circuit according to claim 1 which comprises an auxiliary precharge circuit for precharging the second branch of said first current mirror circuit prior to generation of said reference level.

10. A sensing circuit for a memory comprising a plurality of memory cells, the sensing circuit including:

a reference circuit comprising;

at least one reference cell for generating a reference current in response to a control voltage;

a first current mirror circuit connected to receive in a first branch thereof said reference current and to generate in the second branch thereof a first matched current;

an output device connected to receive said first matched current and to supply a reference level derived from said first matched current;

a dividing circuit for selectively reducing the reference level derived from said first matched current from a first full reference level to a second reduced reference level;

said sensing circuit further comprising an input transistor connected in a current mirror configuration with said output device to produce a reference signal from said reference level;

a sense amplifier having one input for receiving said reference signal and another input for receiving a signal from a selected one of said plurality of memory cells and an output for generating a sensed level dependent on the state of the differential between said reference signal and said signal from a selected one of said memory cells.

11. A sensing circuit according to claim 10 wherein the sense amplifier is a dynamic sense amplifier.

12. A sensing circuit for a memory comprising a reference circuit which has:

at least one reference cell for generating a reference current in response to a control voltage;

a first current mirror circuit connected to receive in a first branch thereof said reference current and to generate in a second branch thereof a first matched current;

an output device connected to receive said first matched current and to supply a reference level derived from said first matched current; and a dividing circuit for selectively reducing the reference level derived from said first matched current form a first, full reference level to a second, reduced reference level, wherein the dividing circuit is a divide by two circuit for generating a second reduced reference level which is half the first, full reference level.

13. A reference circuit comprising:

at least one reference cell for generating a reference current in response to a control voltage;

a first current mirror circuit connected to receive in a first branch thereof said reference current and to generate in a second branch thereof a first matched current;

an output device connected to receive said first matched current and to supply a reference level derived from said first matched current;

a dividing circuit for selectively reducing the reference level derived from said first matched current from a first, full reference level to a second, reduced reference level, wherein the dividing circuit is a divide by two circuit for generating a second, reduced reference level which is half the first, full reference level, and wherein the reference cell is a single transistor floating gate cell.

14. A reference circuit according to claim 13 which comprises a plurality of reference cells operable to generate different reference currents and selection circuitry for selecting a desired one of said reference cells.

15. A reference circuit according to claim 14 wherein the reference cells have different threshold voltages.

16. A reference circuit according to claim 14 wherein the selection circuitry comprises a main selection stage and a subsidiary selection stage.

* * * * *